(12) United States Patent
Yamanaka et al.

(10) Patent No.: US 7,159,785 B2
(45) Date of Patent: Jan. 9, 2007

(54) CORE PIECE AND NON-CONTACT COMMUNICATION TYPE INFORMATION CARRIER USING THE CORE PIECE

(75) Inventors: Yukio Yamanaka, Shimamoto (JP); Saburo Takano, Osaka (JP)

(73) Assignee: Hitachi Maxell, Ltd., Osaka (JP)

( * ) Notice: Subject to any disclaimer, the term of this patent is extended or adjusted under 35 U.S.C. 154(b) by 0 days.

(21) Appl. No.: 10/472,466

(22) PCT Filed: Mar. 18, 2002

(86) PCT No.: PCT/JP02/02560

§ 371 (c)(1), (2), (4) Date: Feb. 25, 2004

(87) PCT Pub. No.: WO02/075646

PCT Pub. Date: Sep. 26, 2002

(65) Prior Publication Data

US 2004/0144847 A1   Jul. 29, 2004

(30) Foreign Application Priority Data

Mar. 19, 2001   (JP) ............................. 2001-078905

(51) Int. Cl.
*G06K 19/06* (2006.01)
(52) U.S. Cl. ...................... 235/492; 235/488; 235/489
(58) Field of Classification Search ........ 235/487–492; 343/872–873, 866–868, 895
See application file for complete search history.

(56) References Cited

U.S. PATENT DOCUMENTS

| | | | | |
|---|---|---|---|---|
| 5,766,535 A | * | 6/1998 | Ong | 264/272.15 |
| 5,958,466 A | * | 9/1999 | Ong | 425/127 |
| 6,160,526 A | * | 12/2000 | Hirai et al. | 343/895 |
| 6,308,894 B1 | * | 10/2001 | Hirai et al. | 235/492 |

FOREIGN PATENT DOCUMENTS

| | | | |
|---|---|---|---|
| EP | 1010543 A1 | | 6/2000 |
| JP | 3-29250 U | | 3/1991 |
| JP | 6-510364 A | | 11/1994 |
| JP | 3008939 U | | 1/1995 |
| JP | 7-146922 A | | 6/1995 |
| JP | 10-193849 A | | 7/1998 |
| JP | 2001-34725 A | | 2/2001 |
| JP | 2004021648 A | * | 1/2004 |
| JP | 2004021649 A | * | 1/2004 |
| JP | 2004295907 A | * | 10/2004 |

* cited by examiner

*Primary Examiner*—Kimberly D. Nguyen
(74) *Attorney, Agent, or Firm*—Birch, Stewart, Kolasch & Birch, LLP

(57) ABSTRACT

An inexpensive non-contact communication type information carrier with good handling capability and productivity, characterized in that an IC chip 1 formed integral with the antenna coil 3 is mounted in a recessed portion 6 of a core piece body 5 to form a core piece 11 and that the core piece 11 is mounted at a predetermined position on the information carrier.

11 Claims, 11 Drawing Sheets

CORE PIECE AND NON-CONTACT COMMUNICATION TYPE INFORMATION CARRIER USING THE CORE PIECE

This application is the national phase under 35 U.S.C. § 371 of PCT International Application No. PCT/JP02/02560 which has an International filing date of Mar. 18, 2002, which designated the United States of America.

TECHNICAL FIELD

The present invention relates to a non-contact communication type information carrier having a semiconductor IC chip integrally formed with a non-contact communication type antenna.

BACKGROUND ART

Proposals have been made to attach an IC chip integrally formed with an antenna coil to parts and products for their inventory management. The IC chip integrally formed with an antenna coil has also been proposed to be embedded in an identity card for room entry management and commuter pass applications.

However, IC chips integrally formed with an antenna coil are hard and easily score their coil formation surfaces when IC chips contact each other. This renders impossible the packing of IC chips in a bag or the use of a parts feeder, thus leaving no alternative but to depend on expensive material handling.

Another drawback is that the IC chip formed integral with an antenna coil is very thin (about 0.2–0.6 mm thick) and fragile, and thus easily develops cracks and chipping due to stresses in the coil formation surface (or its back). This makes secondary processing difficult.

Further, although an insert molding using resin is possible, since the IC chip integrally formed with an antenna coil greatly differs in physical property from a mold resin, a moldability of the IC chip is bad, making it difficult to produce a large number of molded products. This in turn increases cost.

Further, in the case of an insert molding, a thermal expansion of embedded resin and stresses and strains during use have direct adverse effects on the IC chip, resulting in the IC chip circuit being broken in the worse case.

DISCLOSURE OF THE INVENTION

An object of the present invention is to eliminate these drawbacks of the conventional techniques and to provide an inexpensive non-contact communication type information carrier with good handling capability and productivity and a core piece used in the information carrier.

To achieve the above objective, a first means of the present invention comprises: an IC chip formed integral with an antenna coil on one surface thereof; and a core piece body having a recessed portion in which the IC chip is inserted and held.

A second means of the invention according to the first means is characterized in that a part of a circumferential portion of the IC chip, such as corner portions, is locked by a caulking portion formed at an open end of the recessed portion of the core piece body.

A third means of the invention according to the second means is characterized in that a caulking edge forming the caulking portion is provided with notches, such as V- or U-shaped notches.

A fourth means of the invention according to the second means is characterized in that a caulking edge forming the caulking portion is partly provided with thin portions.

A fifth means of the invention according to the first means is characterized in that the IC chip is installed in the recessed portion so that the antenna coil faces a bottom of the core piece body.

A sixth means of the invention according to the first means is characterized in that the core piece body is formed of a transparent material such as polycarbonate resin.

A seventh means of the invention comprises: an IC chip formed integral with an antenna coil on one surface thereof; and a core piece body having a recessed portion in which the IC chip is mounted to form a core piece; wherein the core piece is mounted at a predetermined position on the information carrier.

A eighth means of the invention according to the seventh means is characterized in that the IC chip is installed in the recessed portion so that the antenna coil faces a bottom of the core piece body, that the core piece is mounted in the information carrier so that the bottom of the core piece body is on the front surface side of the information carrier, and that a surface of the bottom of the core piece body does not protrude from a surface of the information carrier.

A ninth means of the invention according to the seventh means is characterized in that the IC chip is square and the antenna coil is formed on the IC chip so that a center of the antenna coil almost aligns with a center of the IC chip, that the core piece body is formed with a circular recessed portion at a center position thereof whose diameter is almost equal to a diagonal length of the IC chip, that the IC chip is mounted in the recessed portion to form the core piece, and that the core piece is mounted in the information carrier.

A tenth means of the invention according to the ninth means is characterized in that the non-contact communication type information carrier is shaped like a disc, and that the disc-shaped information carrier is formed with a circular engagement recess at a central position thereof, in which the core piece is mounted.

A eleventh means of the invention according to the seventh means is characterized in that the core piece and the non-contact communication type information carrier are formed of plastics, and that a material of the core piece is harder than that of the non-contact communication type information carrier.

A twelfth means of the invention according to the seventh means is characterized in that the non-contact communication type information carrier is a case to accommodate a variety of objects to be inspected, such as DNA chips, test tubes and samples.

These and other objects, features and advantages of the present invention will become apparent from the following descriptions of embodiments thereof taken in conjunction with the accompanying drawings.

BEST MODE FOR CARRYING OUT THE INVENTION

Figure 1:
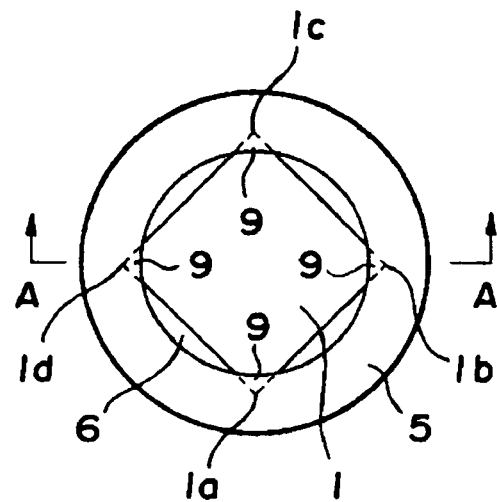
FIG. 1 is a plan view showing a core piece for a non-contact communication type information carrier according to a first embodiment of the present invention.
Figure 2:
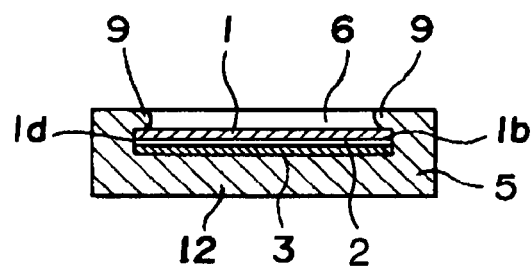
FIG. 2 is a cross-sectional view taken along the line A—A of FIG. 1.
Figure 3:
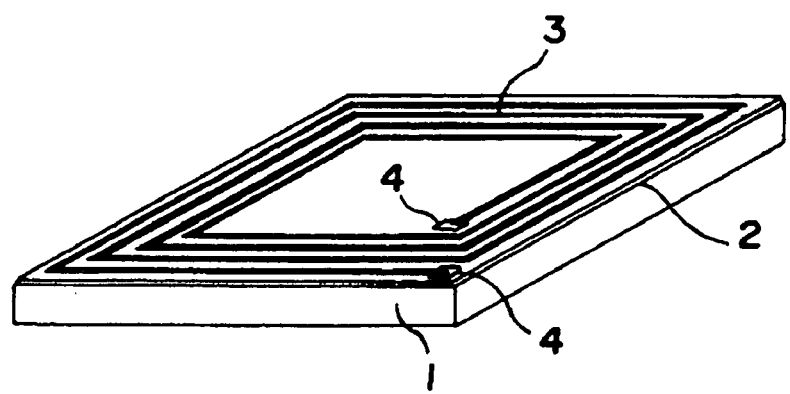
FIG. 3 is an enlarged perspective view of an IC chip formed integral with an antenna coil for use in the core piece.
Figure 4:
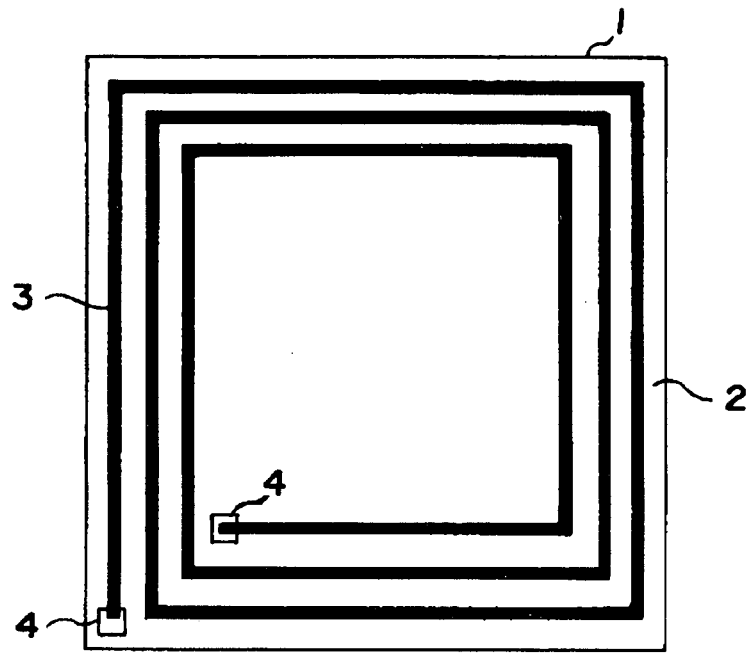
FIG. 4 is an enlarged plan view of the IC chip.
Figure 5:
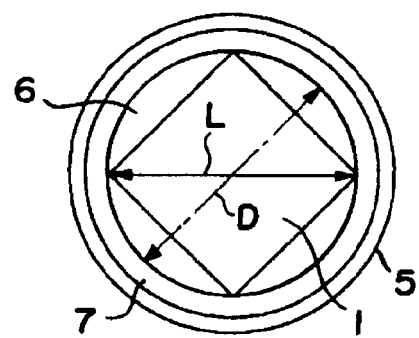
FIG. 5 is a plan view showing a process of mounting the IC chip on a core piece body.
Figure 6:
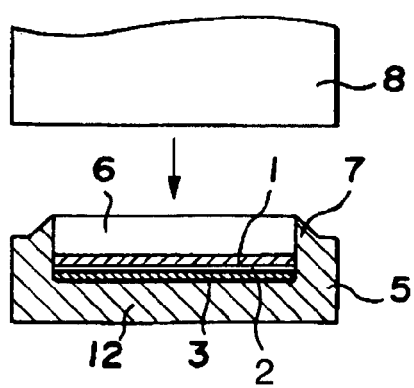
FIG. 6 is a cross-sectional view showing the process of mounting the IC chip on the core piece body.

Embodiments of the present invention will be described by referring to the accompanying drawings. FIG. 1 is a plan view of a core piece for a non-contact communication type information carrier according to the first embodiment. FIG. 2 is a cross-sectional view taken along the line A—A of FIG. 1. FIG. 3 is an enlarged perspective view of an IC chip used in the core piece. FIG. 4 is an enlarged plan view of the IC chip. FIG. 5 and FIG. 6 are a plan view and a cross-sectional view illustrating a process of mounting the IC chip on the core piece body.

As shown in FIG. 3 and FIG. 4, a square IC chip 1 is integrally formed with a rectangular, spiral antenna coil 3 on its circuit formation side through an insulating layer 2 of, for example, polyimide resin. The antenna coil 3 can be formed by an electrocast plating method and a photoresist method and is connected at its ends to input/output terminals 4, 4 of the IC chip 1 via through-holes formed in the insulating layer 2. The IC chip 1 integrally formed with this antenna coil 3 measures about 2–4 mm along its one side and about 0.2–0.6 mm thick.

This IC chip 1, as shown in FIG. 1 and FIG. 2, is mounted on a core piece body 5. The core piece body 5 is formed of an engineering plastic such as thermoplastic synthetic resin and, as shown in FIG. 5 and FIG. 6, has a circular recessed portion 6 at the center, which is integrally formed with a projecting caulking portion 7 along its open circumference. As shown in FIG. 5, an inner diameter D of the recessed portion 6 is set almost equal to a diagonal length L of the IC chip 1 so that inserting the IC chip 1 into the recessed portion 6 causes a center of the IC chip 1 to align with a center of the core piece body 5, i.e., positions the IC chip 1 inside the core piece body 5.

As shown in FIG. 6, the IC chip 1 is inserted, antenna coil 3 side down, into the recessed portion 6. An ultrasonic fusing horn 8 is pressed against the core piece body 5 from above to heat and soften and caulk the caulking portion 7 inwardly to form a caulked portion 9 that engages four corner portions 1a–1d of the IC chip 1, as shown in FIG. 1 and FIG. 2. The IC chip 1 is now firmly held in the recessed portion 6 (swaging method).

While in this example the IC chip 1 is inserted, antenna coil 3 side down, into the recessed portion 6 to protect the antenna coil 3 with a bottom portion 12, it is also possible to insert the IC chip 1 into the recessed portion 6, with the antenna coil 3 side up. Since the surface of the antenna coil 3 is recessed inwardly from the upper surface of the core piece body 5 by a distance equal to the thickness of the caulked portion 9, the antenna coil 3 is protected against being scored when the IC chips 1 are supplied in a bag or by a parts feeder. If the core piece body 5 is formed of a transparent synthetic resin, it can conveniently be checked whether or not the IC chip 1 is mounted.

Figure 7:
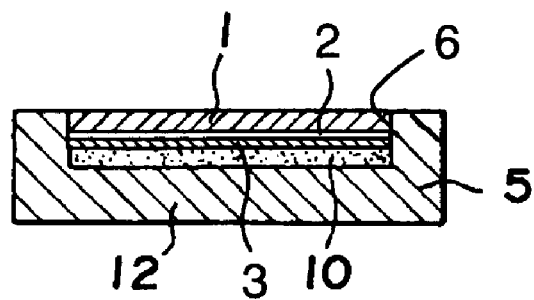
FIG. 7 is a cross-sectional view showing a variation of the core piece for the non-contact communication type information carrier.

FIG. 7 shows another example of mounting the IC chip 1. In this example, the IC chip 1 is inserted and secured to the recessed portion 6 through an adhesive 10. In this case, too, the IC chip 1 is inserted, antenna coil 3 side down, into the recessed portion 6.

Mounting the IC chip 1 in the recessed portion 6 of the core piece body 5 can protect the antenna coil 3 and also make it large enough to facilitate handling, so that the assembly as a core piece 11 can be mass-produced and attached to any members where the IC chips 1 are to be fitted. This construction in particular can protect with the core piece the corner portions 1a–1d of the IC chip that are easily chipped away by stresses that occur during handling of the IC chip 1 or after the chip is fitted to a target product.

Figure 8:
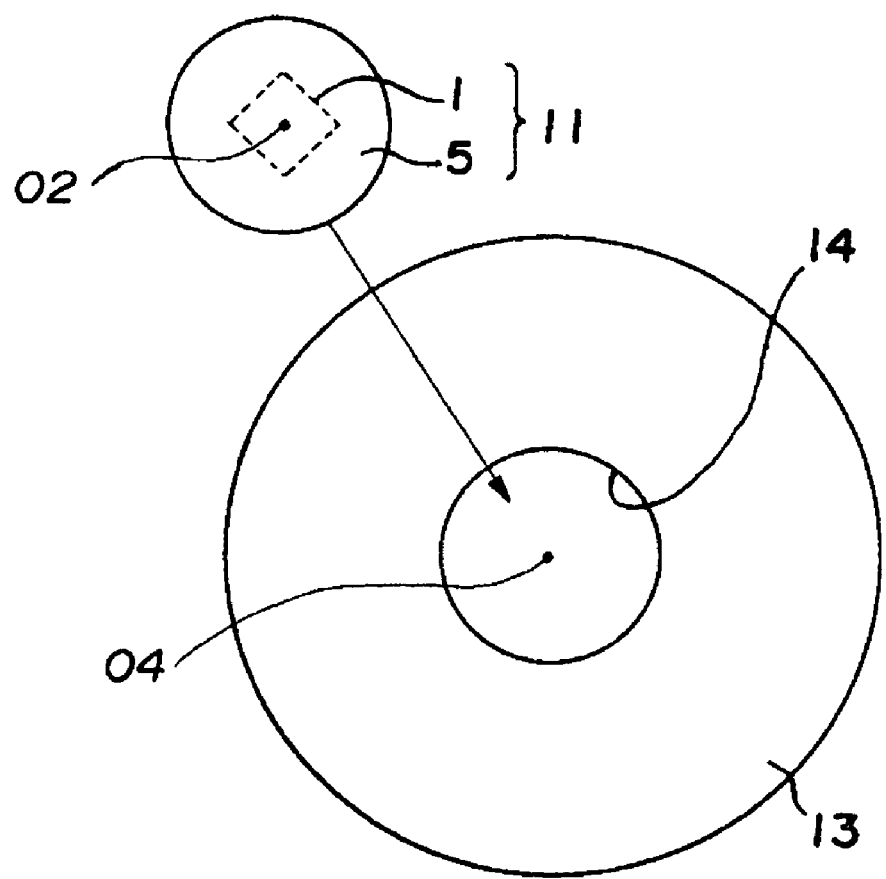
FIG. 8 is a plan view showing a state before the core piece is mounted to a token.
Figure 9:
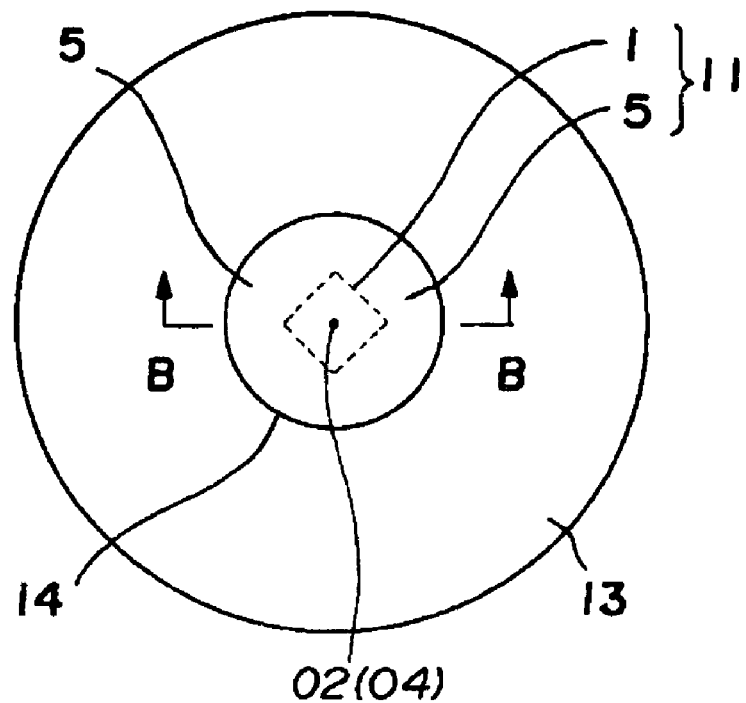
FIG. 9 is a plan view showing a state after the core piece has been mounted to the token.
Figure 10:
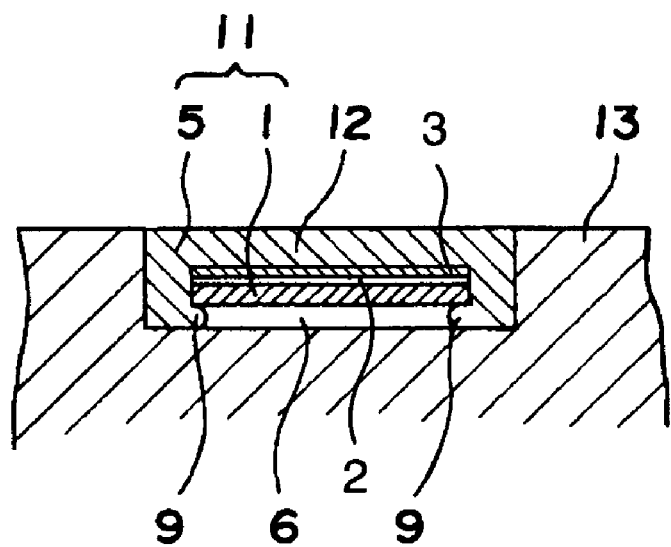
FIG. 10 is an enlarged cross-sectional view taken along the line B—B of FIG. 9.

FIG. 8 to FIG. 10 illustrate an example process of mounting the core piece 11 to a token 13 used in electronic money transactions, with FIG. 8 representing a plan view of a state before the core piece 11 is mounted, FIG. 9 representing a plan view of a state after the core piece 11 is mounted, and FIG. 10 representing an enlarged cross-sectional view taken along the line B—B of FIG. 9. As shown in FIG. 8, the token 13, circular in plan view and molded of a synthetic resin, has an engagement recess 14 of the same shape as the core piece 11 at the center. The IC chip 1 is fitted in the engagement recess 14 and fixed there.

At this time, as shown in FIG. 10, the core piece body 5 is set to have its bottom portion 12 face the front side so that the antenna coil 3 comes as close to the front surface of the token 13 as possible but the surface of the bottom portion 12 does not protrude from the token front surface. With the core piece 11 mounted in the IC chip 13 in this manner, the IC chip 1 storing various information necessary for electronic money transaction, such as pass word and transaction history, can be used.

The core piece 11 and the token 13 may be coupled together with an adhesive or by providing engagement portions (coupling portions) to the core piece body 5 and the token 13.

The core piece 11 is preferably formed of engineering plastics such as polycarbonate or, for applications requiring heat resistance, super-engineering plastics such as PPS (polysulfane) and PEI (polyetherimide). The token 13 is preferably formed of ABS.

As to the materials of the core piece 11 and the information carrier such as token 13 in which the core piece 11 is mounted, a material harder than the body such as token 13 is chosen for the core piece 11, considering a stiffness and stress alleviation.

If the core piece 11 is made of a material of the same kind as the information carrier or of a softer material, when the core piece 11 is inserted into the recessed portion of the information carrier such as token 13 or when a stress develops in use, the core piece 11 is subjected to the stress, resulting in the IC chip corners $1a$–$1d$ being cracked. However, by selecting for the core piece 11 a material harder than that of the information carrier, as in this embodiment, the stress acting on the IC chip can be alleviated, preventing a possible chipping or circuit break of the IC chip.

The hardness described above is an impression hardness, such as Rockwell, Durometer and Barcol hardness. Particularly the Durometer hardness is preferred whose test procedure is specified in JIS Standard K7215 and which determines a hardness from a depth of an impressed dent formed when a specimen is loaded in a test.

Figure 11:
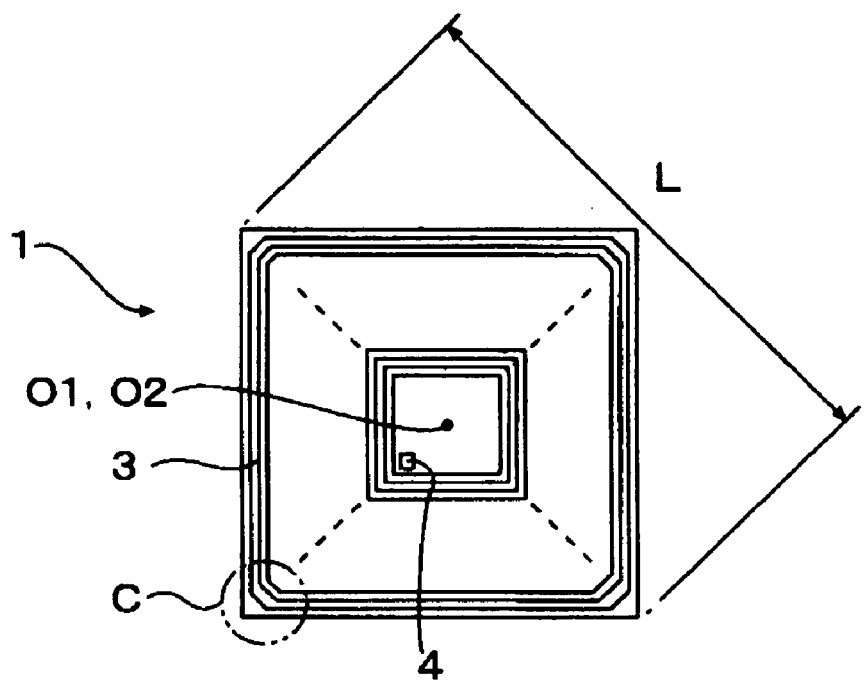
FIG. 11 is a plan view showing an IC chip for a non-contact communication type information carrier according to a second embodiment of the present invention.
Figure 12:
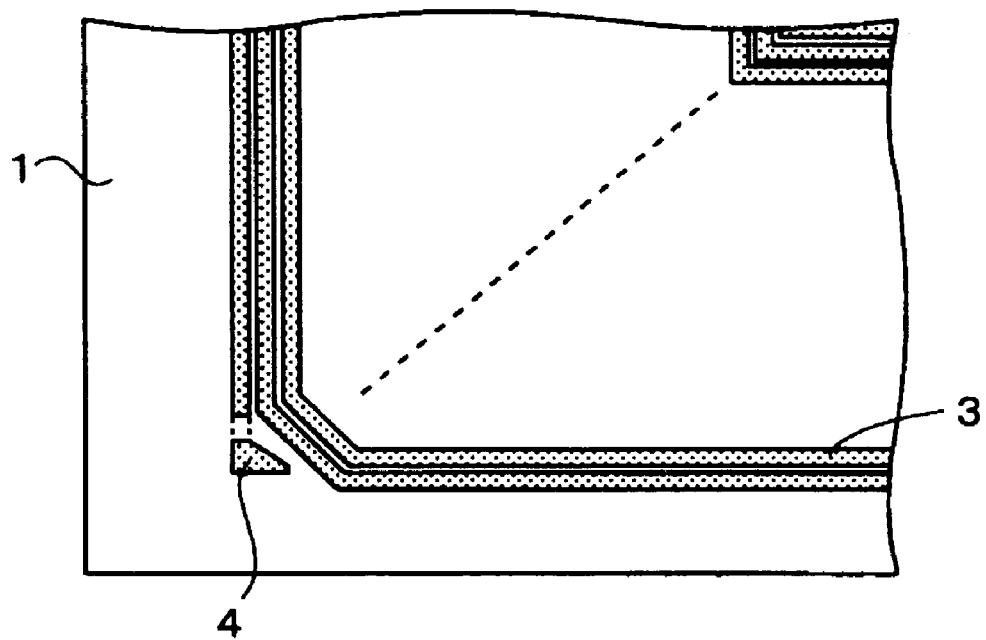
FIG. 12 is an enlarged view of a portion C in FIG. 11.

FIG. 11 to FIG. 16 illustrate a second embodiment of the present invention. FIG. 11 represents a plan view of an IC chip, FIG. 12 an enlarged view of a portion C in FIG. 11, FIG. 13 a plan view of a core piece body, FIG. 14 a partly cutaway front view of the core piece body, FIG. 15 a plan view of a core piece, and FIG. 16 a partly cutaway front view of the core piece.

Depending on its capacity or version, the size of the IC chip 1 may become small. On the other hand, the core piece body 5 may not be able to be reduced in size because of the size of the information carrier on which the core piece body 5 is mounted. This embodiment is suitable for such a case.

The IC chip 1 used in this embodiment is square, measuring 2.3 mm on each side, and is formed integral with a spiral antenna coil 3 on a circuit formation surface through an insulating layer (not shown) of, for instance, polyimide resin. The antenna coil 3 is formed rectangular, spiraling along the outline of the IC chip 1 and, in this embodiment, measures about 14 μm in coil width and has a coil-to-coil interval of about 4 μm and a total of about 47 turns. The ends of the antenna coil 3 are connected to input/output terminals 4, 4 via through-holes formed in the insulating layer. As shown in FIG. 11, the antenna coil 3 is formed on the IC chip 1 in such a manner that the center O1 of the IC chip 1 aligns with the center O2 of the rectangular, spiral antenna coil 3.

Figure 13:
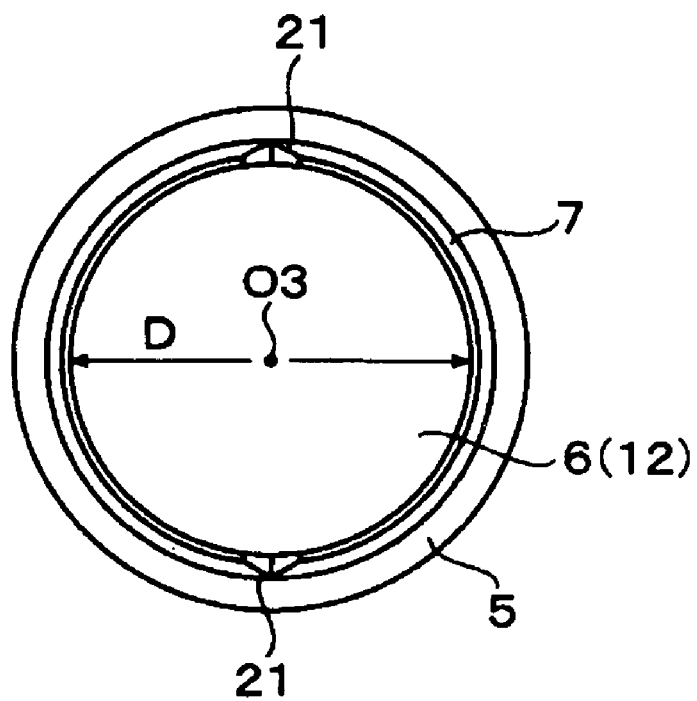
FIG. 13 is a plan view showing a core piece body for use in the non-contact communication type information carrier.
Figure 14:
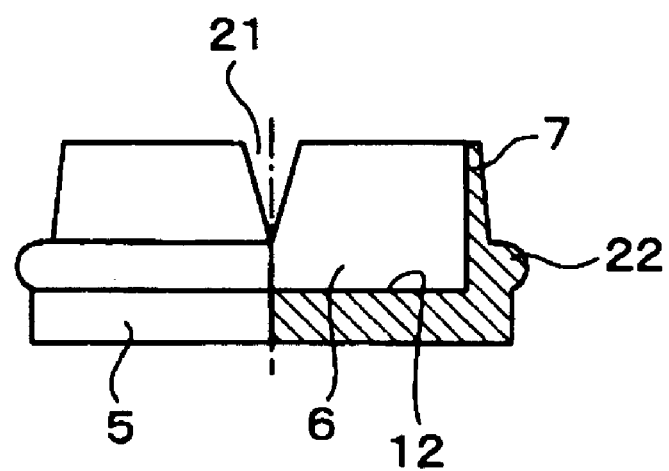
FIG. 14 is a front view of the partly cutaway core piece body.

The core piece body 5 is shaped like a disc and formed of thermoplastic resin, such as polycarbonate resin and epoxy resin. As shown in FIG. 13 and FIG. 14, the core piece body 5 has a circular recessed portion 6 at the center, which is integrally formed with a projecting caulking portion 7 along its open circumference. The caulking portion 7 has one or more V- or U-shaped notches 21 along its circumference.

A diameter D of the recessed portion 6 shown in FIG. 13 is set almost equal to a diagonal length L of the IC chip 1 shown in FIG. 11 so that inserting the IC chip 1 into the recessed portion 6 causes the center O2 of the antenna coil 3 to align with the center O3 of the core piece body 5, i.e., positions the antenna coil 3 (IC chip 1) inside the core piece body 5.

Figure 15:
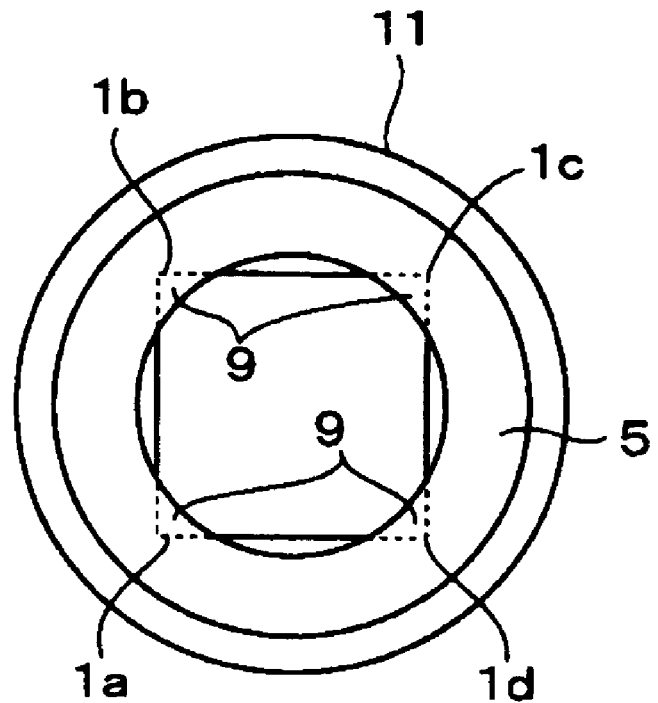
FIG. 15 is a plan view of the core piece.
Figure 16:
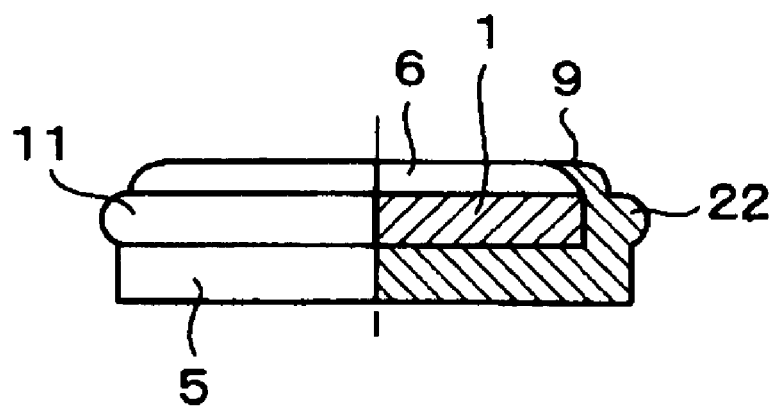
FIG. 16 is a front view of the partly cutaway core piece.

As shown in FIG. 16, the IC chip 1 is inserted, antenna coil 3 side down, into the recessed portion 6. An ultrasonic fusing horn is pressed against the core piece body 5 from above to heat and soften and caulk the caulking portion 7 inwardly to form a caulked portion 9 that engages four corner portions $1a$–$1d$ of the IC chip 1, as shown in FIG. 15 and FIG. 16. The IC chip 1 is now firmly held in the recessed portion 6.

As described above, the provision of the notches 21 ensures that the caulking portion 7 when heated, softened and caulked inwardly does not produce any corrugations, thus forming the caulked portion 9 extending inwardly as shown in FIG. 16. As a result, even a small-size IC chip 1 can be firmly secured inside the core piece body 5. Further, installing the IC chip 1, antenna coil 3 side down, into the recessed portion 6 can protect the antenna coil 3 with the bottom portion 12 of the recessed portion 6.

As shown in FIG. 14 and FIG. 16, the core piece body 5 is formed with one or more annular ribs 22 along its outer circumference. When the core piece body 5 (core piece 11) is pushed under pressure into the engagement recess 14 of the token 13, as shown in FIG. 8, the core piece body 5 is firmly engaged in the engagement recess 14 because of the presence of the annular ribs 22, increasing the coupling strength between the core piece body 5 and the token 13. While in this embodiment the continuous annular ribs 22 are formed along the circumference, the similar effects can also be produced by forming the ribs intermittently along the circumference.

The core piece 11 having the IC chip 1 engaged in the core piece body 5 is pushed under pressure into the engagement recess 14 of the disc-shaped token 13 to form a non-contact communication type information carrier of this embodiment. Since the token 13 has the engagement recess 14 at the center, the center O4 of the token 13 and the center O2 of the IC chip 1 are made to align with each other, though the direction of the IC chip 1 is arbitrary (see FIG. 8 and FIG. 9).

Figure 17:
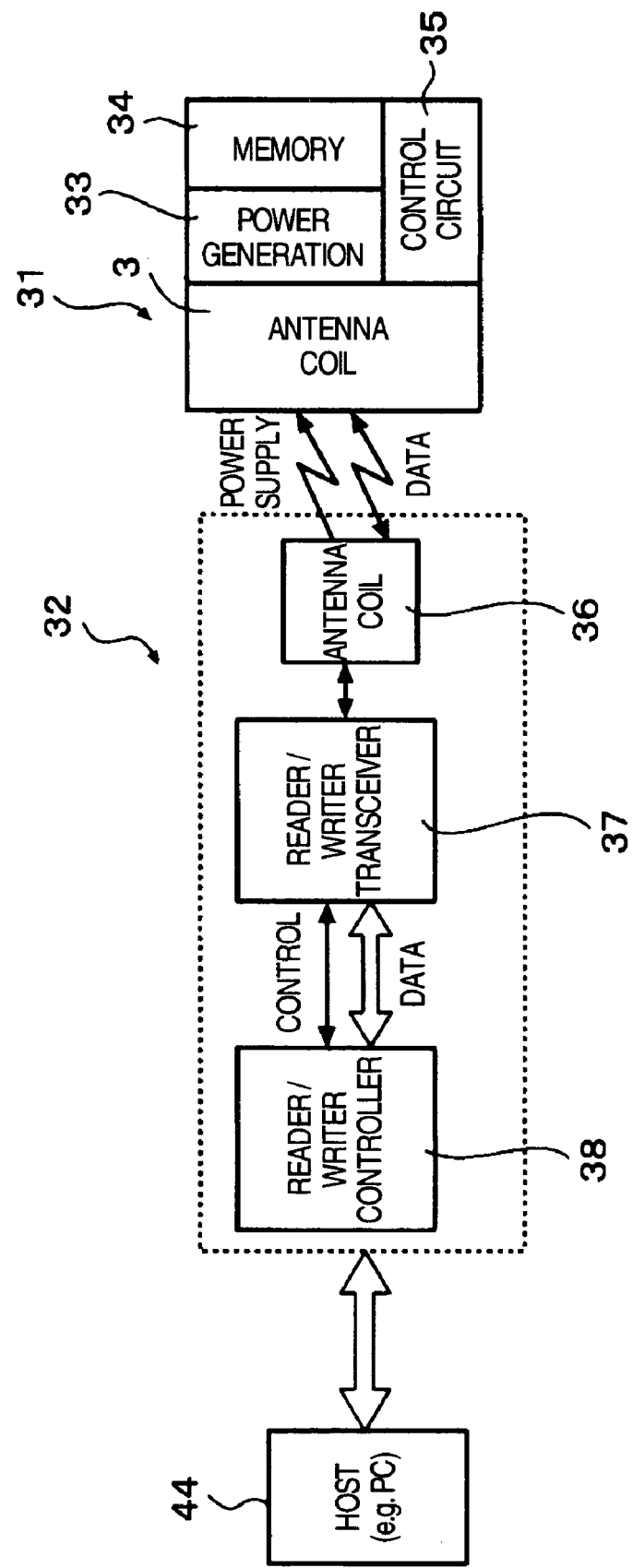
FIG. 17 is a block diagram showing a data transmission system between the non-contact communication type information carrier, a reader/writer and a host computer.

FIG. 17 is a block diagram showing a data transmission system between a non-contact communication type information carrier 31, a reader/writer 32 and a host computer 44 according to the present invention. The information carrier 31 comprises an antenna coil 3, a power generation circuit 33, a memory 34 and a control circuit 35. The reader/writer 32 has an antenna coil 36 corresponding to the antenna coil 3 on the information carrier 31 side, a transceiver 37, and a controller 38. These components are related to each other as shown in the figure.

Figure 18:
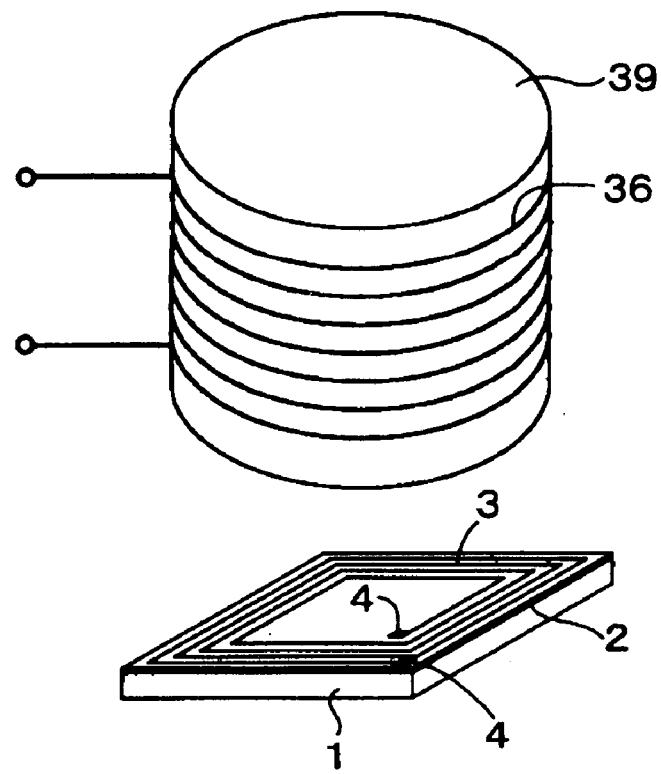
FIG. 18 is a perspective view showing a correspondence between the antenna coil on the information carrier and an antenna coil on the reader/writer.

FIG. 18 illustrates a relation between the antenna coil 3 of the information carrier 31 and the antenna coil 36 of the reader/writer 32. The antenna coil 36 is wound around a circumference of a columnar ferrite core 39 which has a bottom surface of the same size as the external size of the antenna coil 3. The ferrite core 39 is so arranged that its axis is perpendicular to the plane of the antenna coil 3 and that its bottom surface is close to the antenna coil 3.

The token 13 mounted on the reader/writer 32 is positioned by a guide means (not shown) so that the center of the token 13 (the center of the antenna coil 3) aligns with the center of the bottom surface of the ferrite core 39. Therefore, the antenna coil 3 and the antenna coil 36 are electromagnetically coupled together for data transmission, no matter in which direction the token 13 (antenna coil 3) is placed in its own plane.

Figure 19:
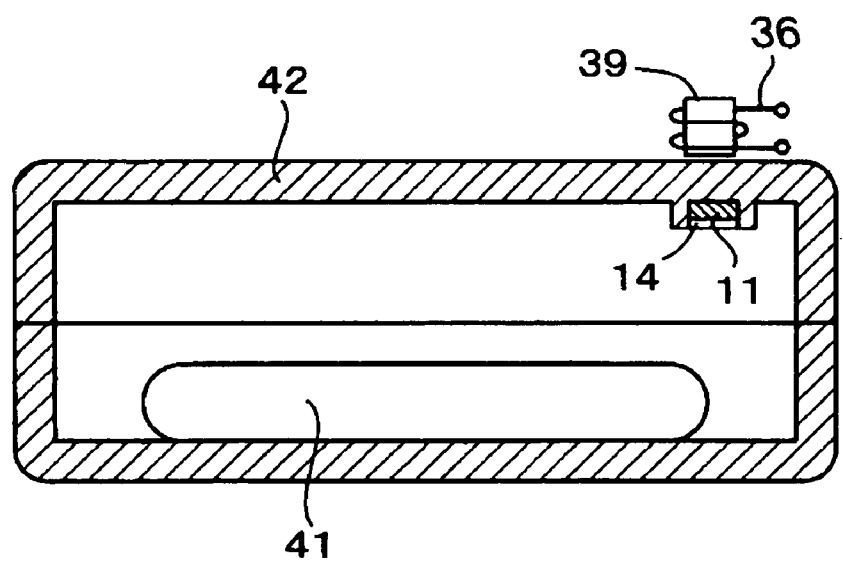
FIG. 19 is a cross-sectional view of a case (non-contact communication type information carrier) according to a third embodiment of the present invention.

FIG. 19 shows a third embodiment of the present invention. On the inner side of a case 42 accommodating a variety of objects 41 to be tested, such as DNA chip, test tube and specimen, a circular engagement recess 14 is formed. The core piece 11 is fitted in the engagement recess 14 so that the antenna coil 3 (not shown) faces toward the outside of the case 42. The memory of the core piece 11 stores a variety of data about the object 41 to be inspected and the data is transmitted between the antenna coil 3 of the core piece 11 and the antenna coil 36 of the reader/writer. In this embodiment, therefore, the case 42 itself serves as a non-contact communication type information carrier.

Figure 20:
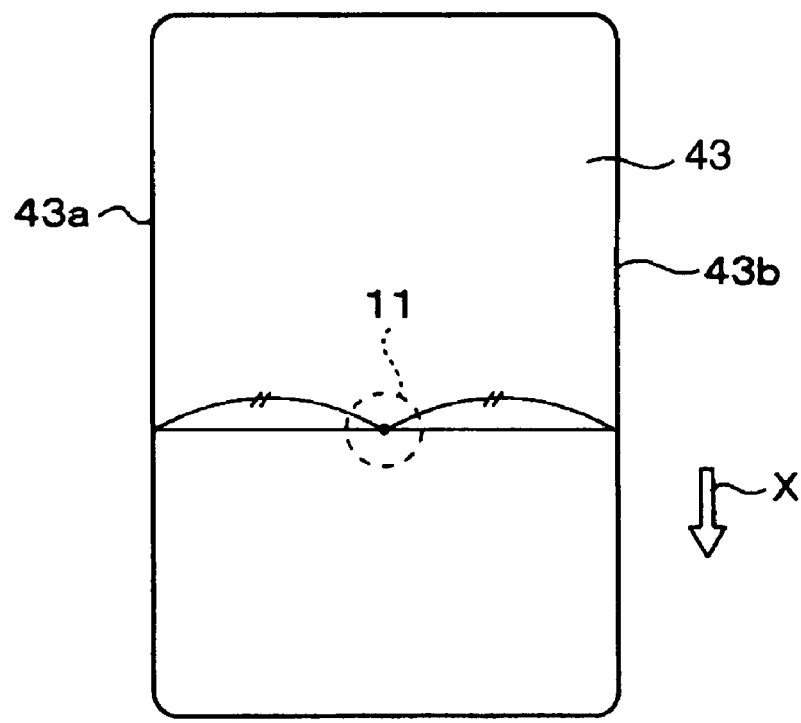
FIG. 20 is a plan view of a card (non-contact communication type information carrier) according to a fourth embodiment of the present invention.

FIG. 20 represents a fourth embodiment of this invention. In this embodiment the core piece 11 is embedded in a card 43, which consists of two card halves of the same shape bonded together with the core piece 11 in between. The core piece 11 is situated at a position which is intermediate between two opposing longer sides 43a, 43b of the card 43 and which is also shifted from a center in a card insertion direction X toward the reader/writer.

Figure 21:
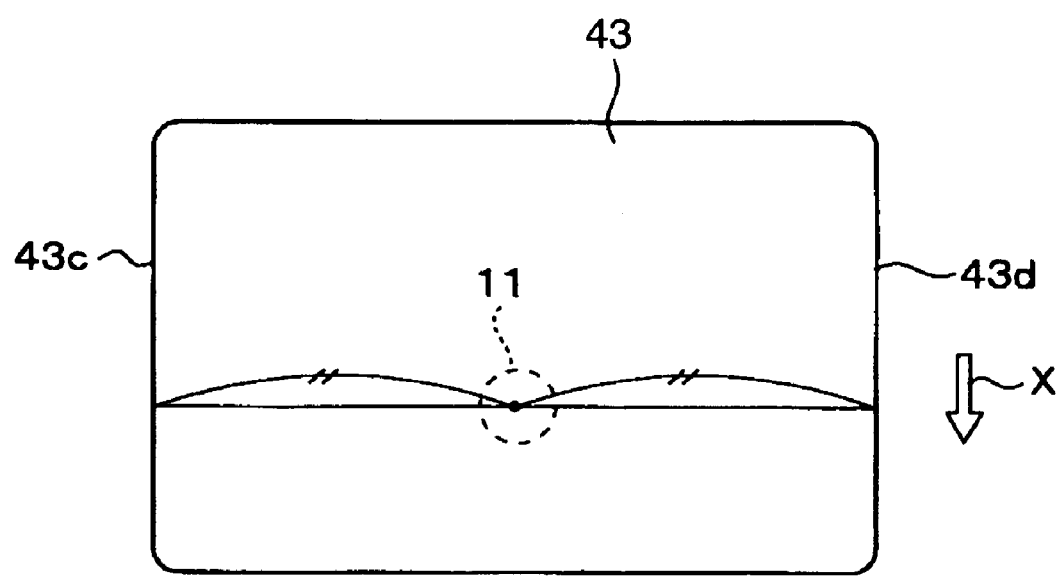
FIG. 21 is a plan view of a card (non-contact communication type information carrier) according to a fifth embodiment of the present invention.

FIG. 21 illustrates a fifth embodiment of this invention. A point in which this embodiment differs from the fourth embodiment is that the core piece 11 is situated at a position which is intermediate between two opposing shorter sides 43c, 43d of the card 43 and which is also shifted from a center in a card insertion direction X toward the reader/writer.

Figure 22:
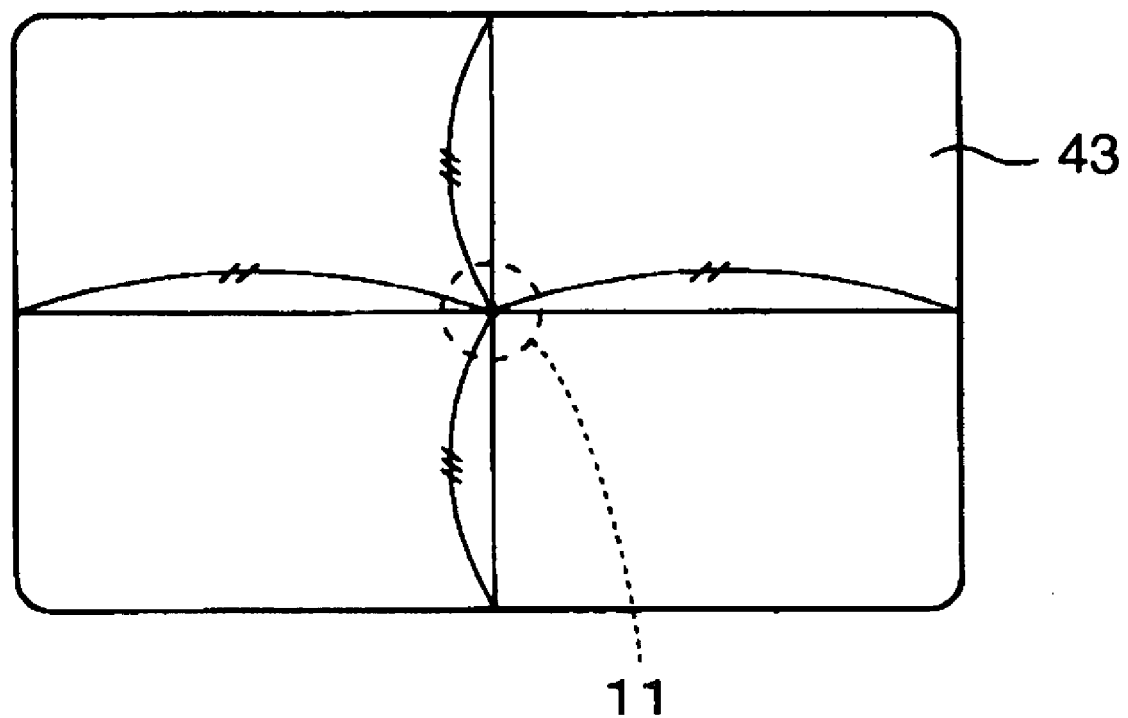
FIG. 22 is a plan view of a card (non-contact communication type information carrier) according to a sixth embodiment of the present invention.

FIG. 22 illustrates a sixth embodiment of this invention. A point in which this embodiment differs from the fourth embodiment is that the core piece 11 is situated at the center of the card 43.

The embedding of the core piece 11 in the card 43 may be accomplished, rather than by bonding two card halves together, but by integrally molding the card with a core piece engagement recess and then fitting the core piece into the engagement recess.

While in this embodiment the core piece body is formed with a caulking portion by which the IC chip is held in the recessed portion, it is also possible to simply fit the IC chip in the recessed portion and hold it there, rather than forming the caulking portion.

The application of the non-contact communication type information carrier according to the present invention is not limited to tokens, cards, and cases accommodating a variety of objects to be inspected, such as DNA chips, test tubes and specimens, but it can also be applied to a wide range of industrial fields.

For example, it can be applied to very small areas where its applications have so far been considered impossible, such as connectors, frames and cases of electronic cards compatible with PC card standard and compact flash standard, front ends of pen type pointing devices, connectors of LAN cables and optical cables, automotive keys, cases of optical discs, magnetic discs and tape media, and media themselves.

INDUSTRIAL APPLICABILITY

With the invention according to claim 1, since the IC chip formed integral with the antenna coil is inserted and held in the recessed portion of the core piece body, the coil formation surface can be protected and the IC chip can be made large enough to facilitate handling. This in turn allows the IC chips to be packed in bags and supplied by a parts feeder. It is therefore possible to provide a low-cost core piece for a non-contact communication type information carrier with good handling capability and productivity.

With the invention according to claim 2, since a part of a circumferential portion of the IC chip is locked by a caulking portion formed at an open end of the recessed portion of the core piece body, the IC chip is protected against being stressed excessively, preventing possible cracking or chipping.

With the invention according to claim 3, since a caulking edge forming the caulking portion is provided with notches, the caulking portion free of corrugations can be formed, reliably securing the IC chip to the recessed portion of the core piece body even if the IC chip is reduced in size.

With the invention according to claim 4, since a caulking edge forming the caulking portion is provided with thin portions, the caulking portion with no corrugations can be formed, reliably securing the IC chip to the recessed portion of the core piece body even if the IC chip is reduced in size.

With the invention according to claim 5, since the IC chip is installed in the recessed portion so that the antenna coil faces a bottom of the core piece body, the coil formation surface can be reliably protected.

With the invention according to claim 6, since the core piece body is formed of a transparent material, a mounting state of the IC chip can be checked conveniently from outside.

With the invention according to claim 7, since the IC chip formed integral with an antenna coil is mounted in a recessed portion of the core piece body, the coil formation surface can be protected and the IC chip can be made large enough to facilitate handling. This in turn allows the IC chips to be packed in bags and supplied by a parts feeder. It is therefore possible to provide a low-cost non-contact communication type information carrier with good handling capability and productivity.

Further, where information carriers are of differing kinds, shapes and specifications, it is possible to use the same core pieces commonly for these information carriers by forming their core piece mounting portions to the same shape.

With the invention according to claim 8, since the IC chip is installed in the recessed portion so that the antenna coil faces a bottom of the core piece body, since the core piece is mounted in the information carrier so that the bottom of the core piece body is on the front surface side of the information carrier, and since a surface of the bottom of the core piece body does not protrude from a surface of the information carrier, the coil formation surface can be protected and the information carrier can be smoothly handled without the core piece being caught by other objects (e.g., during insertion and removal of the information carrier to and from the reader/writer).

With the invention according to claim 9, since the IC chip is square and the antenna coil is formed on the IC chip so that a center of the antenna coil almost aligns with a center of the IC chip, since the core piece body is formed with a circular recessed portion at a center position thereof whose diameter is almost equal to a diagonal length of the IC chip, since the IC chip is mounted in the recessed portion to form the core piece, and since the core piece is mounted in the information carrier, there is no need to take into account a direction of the small IC chip when mounting it on the core piece body, thus facilitating the IC chip mounting process and enhancing the productivity.

With the invention according to claim 10, since the non-contact communication type information carrier is shaped like a disc and since the disc-shaped information carrier is formed with a circular engagement recess at a central position thereof, in which the core piece is mounted, there is no need to take into account a direction in which the information carrier is inserted into the reader/writer, making the non-contact communication type information carrier easy to handle and lowering its cost.

With the invention according to claim 11, since the core piece and the non-contact communication type information carrier are formed of plastics and since a material of the core piece is harder than that of the non-contact communication type information carrier, when the core piece 11 is fitted into the recessed portion of the information carrier or when a stress develops during the use of the information carrier, the stress acting on the IC chip can be alleviated, preventing a possible cracking or circuit break of the IC chip.

With the invention according to claim 12, since the non-contact communication type information carrier is a case to accommodate a variety of objects to be inspected, such as DNA chips, test tubes and samples, it is possible to provide at low cost a case that can reliably position these objects for non-contact communication and allows for management of the objects being inspected.

The above descriptions have been made of example embodiments and it is apparent to a person skilled in the art that various changes and modifications may be made within the spirit and the scope of claims of the present invention.

The invention claimed is:

1. A core piece for a non-contact communication information carrier, comprising:
   an IC chip having an insulating layer formed over a circuit formation surface thereof, through-holes formed in the insulating layer and an antenna coil formed on the insulating layer and electrically connected via the through-holes to a circuit formed on the circuit formation surface, whereby the antenna coil is formed integrally so that the entire coil is formed on the surface of the IC chip; and
   a core piece body having a recessed portion and a caulking portion formed at an open end of the recessed portion;
   wherein the IC chip is inserted into the recessed portion of the core piece body and a part of a circumferential portion of the IC chip is locked by the caulking portion along only a circumferential portion of the IC chip.

2. A core piece for a non-contact communication information carrier according to claim 1, wherein a caulking edge forming the caulking portion is provided with notches.

3. A core piece for a non-contact communication information carrier according to claim 1, wherein a caulking edge forming the caulking portion is partly provided with thin portions.

4. A core piece for a non-contact communication information carrier according to claim 1, wherein the IC chip is installed in the recessed portion so that the antenna coil faces a bottom of the core piece body.

5. A core piece for a non-contact communication information carrier according to claim 1, wherein the core piece body is formed of a transparent material.

6. A non-contact communication information carrier, comprising:
   an IC chip having an insulating layer formed over a circuit formation surface thereof, through-holes formed in the insulating layer and an antenna coil formed on the insulating layer and electrically connected via the through-holes to a circuit formed on the circuit formation surface; and
   a core piece body having a recessed portion;
   wherein the IC chip is mounted in the recessed portion of the core piece body to form a core piece and the core piece is mounted at a predetermined position on the information carrier,
   whereby the surface of said antenna coil is recessed inwardly from the upper surface of the core piece body.

7. A non-contact communication information carrier according to claim 6, wherein the IC chip is installed in the recessed portion so that the antenna coil faces a bottom of the core piece body, wherein the core piece is mounted in the information carrier so that the bottom of the core piece body is on the front surface side of the information carrier, wherein a surface of the bottom of the core piece body does not protrude from a surface of the information carrier.

8. A non-contact communication information carrier according to claim 6, wherein the IC chip is square and the antenna coil is formed integral with the IC chip so that a center of the antenna coil almost aligns with a center of the IC chip, wherein the core piece body is formed with a circular recessed portion at a center position thereof whose diameter is almost equal to a diagonal length of the IC chip, wherein the IC chip is mounted in the recessed portion to form the core piece, wherein the core piece is mounted in the information carrier.

9. A non-contact communication information carrier according to claim 8, wherein the non-contact communication information carrier is disc-shaped, wherein the disc-shaped information carrier is formed with a circular engagement recess at a central position thereof, in which the core piece is mounted.

10. A non-contact communication information carrier according to claim 6, wherein the core piece and the non-contact communication information carrier are formed of plastics, wherein a material of the core piece is harder than that of the non-contact communication information carrier.

11. A non-contact communication information carrier according to claim 6, wherein the non-contact communication information carrier is a case to accommodate an object to be inspected.

* * * * *